(12) United States Patent
Tanaka et al.

(10) Patent No.: US 7,799,652 B2
(45) Date of Patent: Sep. 21, 2010

(54) METHOD FOR PRODUCING EPITAXIAL WAFER WITH BURIED DIFFUSION LAYER AND EPITAXIAL WAFER WITH BURIED DIFFUSION LAYER

(75) Inventors: Norimichi Tanaka, Gunma (JP); Takashi Itami, Gunma (JP); Hiroyuki Kobayashi, Gunma (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 863 days.

(21) Appl. No.: 11/604,345

(22) Filed: Nov. 27, 2006

(65) Prior Publication Data
US 2007/0122990 A1    May 31, 2007

(30) Foreign Application Priority Data
Nov. 29, 2005    (JP)    ............................. 2005-343055

(51) Int. Cl.
*H01L 21/331*    (2006.01)
(52) U.S. Cl. .................... 438/357; 438/370; 438/526
(58) Field of Classification Search ................ 438/526, 438/370, 357
See application file for complete search history.

(56) References Cited

U.S. PATENT DOCUMENTS 4,517,106 A * 5/1985 Hopkins et al. ............ 252/79.4
5,476,800 A * 12/1995 Burton et al. ............... 438/506
2002/0050605 A1* 5/2002 Jenq ........................... 257/200

FOREIGN PATENT DOCUMENTS

JP    A 05-183046    7/1993

* cited by examiner

*Primary Examiner*—Ha Tran T Nguyen
*Assistant Examiner*—Aaron A Dehne
(74) *Attorney, Agent, or Firm*—Oliff & Berridge, PLC

(57) ABSTRACT

There is disclosed a method for producing an epitaxial wafer with a buried diffusion layer comprising:
  implanting an impurity into a silicon single crystal wafer;
  subsequently diffusing the impurity in the wafer to form a diffusion layer;
  at least removing an oxide film on the diffusion layer; and
  thereafter forming a silicon epitaxial layer over the wafer to produce a silicon epitaxial wafer with a buried diffusion layer;
  wherein at least the oxide film on the diffusion layer is removed by etching with hydrofluoric acid to which a surfactant is added, and then the silicon epitaxial layer is formed. There can be provided a method for producing an epitaxial wafer with a buried diffusion layer in which generation of crystal defects in a silicon epitaxial layer is reduced effectively and an epitaxial wafer with a buried diffusion layer.

1 Claim, 3 Drawing Sheets

METHOD FOR PRODUCING EPITAXIAL WAFER WITH BURIED DIFFUSION LAYER AND EPITAXIAL WAFER WITH BURIED DIFFUSION LAYER

BACKGROUND OF THE INVENTION

1. Field of the Invention

The present invention relates to a method for producing a silicon epitaxial wafer with a buried diffusion layer in which an impurity is ion-implanted, and an epitaxial wafer with a buried diffusion layer, and more particularly, to a case that Sb is implanted as the impurity.

2. Description of the Related Art

Techniques for obtaining a silicon epitaxial wafer for a device such as a bipolar device, a BiCMOS device, and a power IC are commonly known. Such a wafer is obtained, for example, by diffusing an impurity in a silicon single crystal wafer obtained from a silicon single crystal ingot produced by the Czochralski method, or the floating zone method to form a p- or n-type diffusion layer, and growing a silicon epitaxial layer on the diffusion layer by vapor-phase epitaxy. For example, Japanese Unexamined Patent Application Publication No. H05-183046 discloses an example of a method for forming a buried diffusion layer.

Hereinafter, a conventional method for producing a silicon epitaxial wafer with a buried diffusion layer is explained in detail.

First, an oxide film is formed on a silicon single crystal wafer, for example, by thermal oxidation. On the oxide film, a mask pattern is formed by photolithography.

Next, for example, an n-type impurity is implanted into the wafer by ion implantation method. The impurity is diffused to form a diffusion layer. At the time of diffusing the implanted impurity to form a diffusion layer, the wafer is annealed. This anneal also provides an oxide film on the diffusion layer.

Then, the oxide film formed on the wafer (the oxide film portion that was covered by the mask and the oxide film on the diffusion layer) is removed by etching with hydrofluoric acid. Furthermore, the wafer is cleaned with the SC-1 solution (ammonia and aqueous hydrogen peroxide) and so on, and then the wafer is dried.

After that, on the silicon wafer with the buried diffusion layer, a silicon epitaxial layer is formed, for example, by vapor-phase epitaxy. In this way, the diffusion layer is buried.

As mentioned above, a silicon epitaxial wafer with a buried diffusion layer (an epitaxial wafer with a buried diffusion layer) is obtained.

However, when an epitaxial layer is formed, for example, on a wafer into which Sb is implanted at a high dose of $1.0 \times 10^{16}$ ions/cm$^2$ or more by the conventional production method, crystal defects tend to generate where Sb is implanted. Accordingly, crystal defects often generate or many crystal defects generate in the epitaxial layer.

The crystal defects in the epitaxial layer generate even when the wafer undergoes a heat treatment (oxidation) for restoring crystallinity after the Sb implantation. After all, generation of the crystal defects cannot be prevented.

The generation of the crystal defects depends on Sb dose to be implanted. When Sb dose lowers, generation of the crystal defects is reduced. Therefore, there have conventionally been no other choice but to implant Sb at a dose of $1.0 \times 10^{16}$ ions/cm$^2$ or less in view of generation of the crystal defects. Consequently, it has been difficult to obtain an epitaxial wafer in which generation of crystal defects is reduced and Sb is implanted at a high dose.

SUMMARY OF THE INVENTION

The present invention has been accomplished to overcome the above-mentioned problems, and an object of the present invention is to provide a method for producing an epitaxial wafer with a buried diffusion layer in which generation of crystal defects in a silicon epitaxial layer is reduced effectively and an epitaxial wafer with a buried diffusion layer. In particular, the object is to reduce generation of crystal defects in the silicon epitaxial layer when Sb is implanted as an impurity at a high dose of, for example, $1.0 \times 10^{16}$ ions/cm$^2$ or more.

To achieve the above object, the present invention provides a method for producing an epitaxial wafer with a buried diffusion layer comprising:

implanting an impurity into a silicon single crystal wafer;

subsequently diffusing the impurity in the wafer to form a diffusion layer;

at least removing an oxide film on the diffusion layer; and thereafter forming a silicon epitaxial layer over the wafer to produce a silicon epitaxial wafer with a buried diffusion layer;

wherein at least the oxide film on the diffusion layer is removed by etching with hydrofluoric acid to which a surfactant is added, and then the silicon epitaxial layer is formed.

In this way, when the oxide film on the diffusion layer is removed by etching with hydrofluoric acid to which a surfactant is added, and then the silicon epitaxial layer is formed, generation of crystal defects is reduced effectively in the formed silicon epitaxial layer. Therefore, an epitaxial wafer of high quality with a buried diffusion layer in which crystal defects are reduced can be produced easily.

In the above case, the impurity to be implanted into the silicon single crystal wafer can be Sb. Furthermore, the impurity can be implanted into the silicon single crystal wafer at a dose of $1.0 \times 10^{16}$ ions/cm$^2$ or more.

As mentioned above, the impurity to be implanted into the wafer can be Sb, for example, when an n-type diffusion layer is formed. Furthermore, when the impurity is implanted at a dose of $1.0 \times 10^{16}$ ions/cm$^2$ or more, an epitaxial wafer of high quality with a buried diffusion layer in which the diffusion layer has a high dose of the impurity and lower resistivity can be produced.

As mentioned above, especially when Sb is implanted into a wafer as the impurity at a high dose of $1.0 \times 10^{16}$ ions/cm$^2$ or more, conventional production methods often provide crystal defects in the formed silicon epitaxial layer even though the wafer undergoes a heat treatment for restoring crystallinity after the implantation. On the other hand, use of the production method according to the present invention makes it possible to reduce effectively generation of crystal defects in the silicon epitaxial layer even when Sb is implanted at a high dose of $1.0 \times 10^{16}$ ions/cm$^2$ or more.

An epitaxial wafer with a buried diffusion layer produced by the method for producing an epitaxial wafer with buried diffusion layer according to the present invention is of high quality because generation of crystal defects is reduced in the silicon epitaxial layer of the wafer.

Moreover, the present invention provides an epitaxial wafer with a buried diffusion layer comprising: at least a buried diffusion layer in which Sb is implanted; and a silicon epitaxial layer formed on the buried diffusion layer;

wherein Sb dose to the buried diffusion layer is $1.0 \times 10^{16}$ ions/cm$^2$ or more.

Such an epitaxial wafer with a buried diffusion layer comprising: at least a buried diffusion layer in which Sb is implanted; and a silicon epitaxial layer formed on the buried diffusion layer;

wherein Sb dose to the buried diffusion layer is $1.0\times10^{16}$ ions/cm$^2$ or more, has the diffusion layer with an extremely high dose of Sb and lower resistivity.

In this case, it is preferable that a density of crystal defects measured with an optical microscope on the surface of the silicon epitaxial layer is 0 per mm$^2$.

In this way, when a density of crystal defects measured with an optical microscope on the surface of the silicon epitaxial layer is 0 per mm$^2$, such an epitaxial wafer with a buried diffusion layer is of extremely high quality in which crystal defects are reduced.

The method for producing an epitaxial wafer with a buried diffusion layer according to the present invention makes it possible to reduce effectively generation of crystal defects in a formed silicon epitaxial layer. In addition, the epitaxial wafer with a buried diffusion layer according to the present invention has a diffusion layer in which Sb is implanted at a high dose of $1.0\times10^{16}$ ions/cm$^2$ or more. Consequently, the present invention provides an epitaxial wafer with a buried diffusion layer of high quality in which a density of crystal defects on the surface of the silicon epitaxial layer is 0 per mm$^2$ even when Sb is implanted at a high dose.

DESCRIPTION OF THE INVENTION AND A PREFERRED EMBODIMENT

Figure 1:
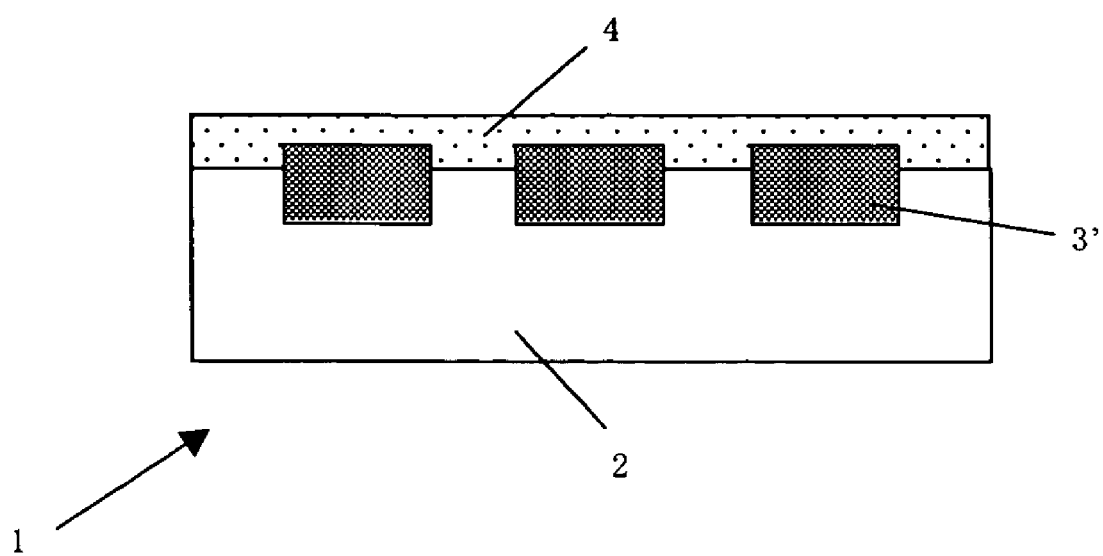
FIG. 1 is a schematic view of one example of an epitaxial wafer with a buried diffusion layer according to the present invention.

Hereinafter, an embodiment of the present invention will be explained. However, the present invention is not limited thereto.

The conventional methods for producing a silicon epitaxial wafer with a buried diffusion layer have a problem that many crystal defects are generated in a silicon epitaxial layer that is formed on the diffusion layer.

The crystal defects are highly apt to generate particularly when Sb is implanted into a silicon single crystal wafer as an impurity at a high dose of, for example, $1.0\times10^{16}$ ions/cm$^2$ or more.

The crystal defects in the epitaxial layer generate even when the wafer undergoes a heat treatment for restoring crystallinity of Sb implanted portions after the Sb implantation. After all, it has been impossible to prevent generation of the crystal defects.

The generation of the crystal defects depends on Sb dose. Accordingly, to reduce generation of the crystal defects, Sb has conventionally been implanted at a dose of less than $1.0\times10^{16}$ ions/cm$^2$. It has been impossible to obtain an epitaxial wafer of high quality having a diffusion layer with Sb dose of $1.0\times10^{16}$ ions/cm$^2$ or more.

Then the present inventors investigated thoroughly the crystal defects in the epitaxial layer. Conventionally, at least, an oxide film formed on the diffusion layer and so on has been removed by etching with hydrofluoric acid before a silicon epitaxial layer is formed. The present inventors have found that, in this step, removing the oxide film by etching with hydrofluoric acid to which a surfactant is added reduces effectively generation of crystal defects in a silicon epitaxial layer to be formed subsequently even when Sb is implanted at a high dose. Thus, they have accomplished the present invention.

Hereinafter, an embodiment of the present invention will be explained in detail with referring to the drawings.

FIG. 1 is a schematic view of one example of an epitaxial wafer with a buried diffusion layer according to the present invention. An epitaxial wafer 1 with a buried diffusion layer according to the present invention in FIG. 1 has at least a buried diffusion layer 3' in which Sb is implanted; and a silicon epitaxial layer 4.

The buried diffusion layer 3' is formed by implanting Sb into a silicon single crystal wafer 2 and diffusing the implanted Sb in the wafer. Besides, Sb dose is high of $1.0\times10^{16}$ ions/cm$^2$ or more.

As mentioned above, Sb has conventionally been implanted at a dose of less than $1.0\times10^{16}$ ions/cm$^2$ in view of generation of crystal defects in the silicon epitaxial layer 4. On the other hand, the epitaxial wafer 1 with a buried diffusion layer according to the present invention has a high Sb dose of $1.0\times10^{16}$ ions/cm$^2$ or more.

Furthermore, a density of crystal defects measured with an optical microscope on the surface of the silicon epitaxial layer 4 is 0 per mm$^2$.

Conventionally, when Sb dose to the buried diffusion layer is a high value of, for example, $1.0\times10^{16}$ ions/cm$^2$ or more, many crystal defects have generated in the silicon epitaxial layer. On the other hand, the epitaxial wafer 1 with a buried diffusion layer according to the present invention is of high quality in which generation of crystal defects in the silicon epitaxial layer 4 is extremely reduced even when Sb dose to the buried diffusion layer is high of $1.0\times10^{16}$ ions/cm$^2$ or more.

The epitaxial wafer 1 with a buried diffusion layer according to the present invention can be produced by the following method.

Figure 2:
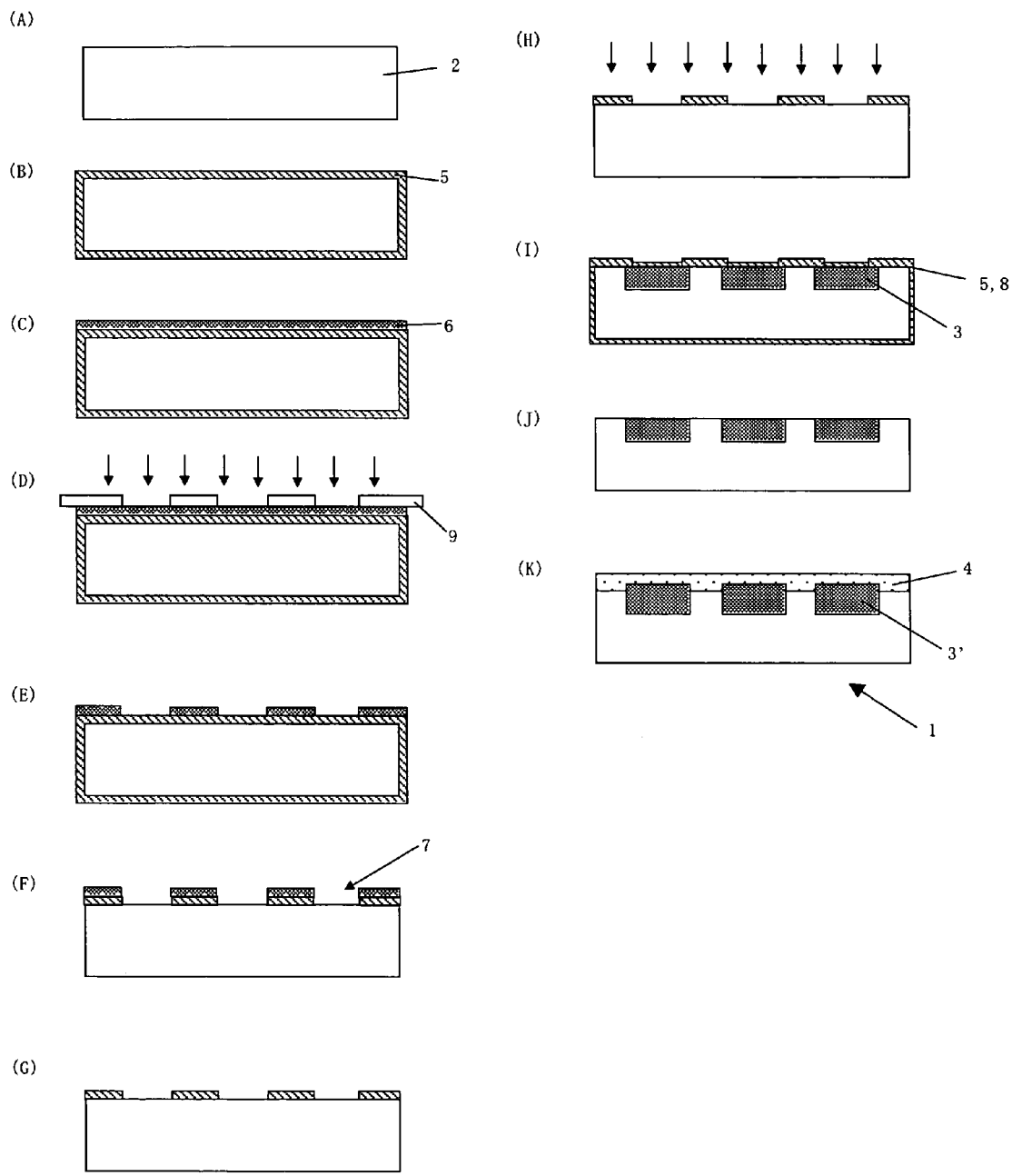
FIG. 2 is a flow chart showing one example of production processes for carrying out the method for producing an epitaxial wafer with a buried diffusion layer according to the present invention.

FIG. 2 is a flow chart showing one example of production processes for carrying out the method for producing an epitaxial wafer with a buried diffusion layer according to the present invention.

First, a silicon single crystal wafer 2 is prepared (see FIG. 2(A)). A method for producing the wafer 2 is not particularly limited. For example, the wafer 2 can be produced by slicing a wafer from a silicon single crystal ingot produced by the Czochralski method or the floating zone method, chamfering, grinding and polishing the wafer. The wafer 2 may is preferably produced with setting conditions in each process to obtain a wafer with desired thickness, size, crystal orientation, resistivity and so on.

Second, on the surface of thus-obtained silicon single crystal wafer 2, an oxide film 5 is formed (see FIG. 2(B)). The oxide film 5 can be formed on the silicon single crystal wafer 2, for example, by subjecting the wafer 2 to a heat treatment under oxidizing ambient with a thermal oxidation furnace. The oxide film 5 satisfies the requirement as long as it acts as a mask when an impurity is subsequently implanted into the silicon single crystal wafer 2. A method for forming the oxide film 5 is not particularly limited.

Then, resist 6 is applied to the silicon single crystal wafer 2 on which the oxide film 5 is formed. The resist 6 is applied to at least a wafer surface (the front surface) into which an impurity is implanted (see FIG. 2(C)). The resist 6 may be applied, for example, by spin coating, or with a brush or a roller.

The resist 6 is prebaked. Then the resist 6 is exposed so that a pattern of openings through which an impurity is implanted into the silicon single crystal wafer 2 is formed. Thus a pattern of a mask 9 is transferred to the resist 6 (see FIG. 2(D)). The resist 6 is annealed and then developed (see FIG. 2(E)).

After that, openings 7 are formed on the front surface of the silicon single crystal wafer 2 by etching with hydrofluoric acid and so on and removing the oxide film portions corresponding to the openings through which an impurity is implanted by using the pattern-formed resist 6 as a mask (see FIG. 2(F)). At the same time, an oxide film on the back surface and the side of the silicon single crystal wafer 2 is removed by etching. Then, remaining resist 6 on the oxide film 5 that is formed on the front surface of the wafer 2 is removed (see FIG. 2(G)).

Next, an impurity/impurities is/are implanted into the silicon single crystal wafer 2 from the side in which the pattern-formed oxide film 5 is formed with an ion implantation device (see FIG. 2(H)). A case that Sb is implanted as the impurity is explained here. Or, for example, As, P, B, or Ga may be implanted. The impurity that is implanted into the silicon single crystal wafer 2 is properly determined according to a diffusion layer to be formed such as n-type or p-type. Incidentally, acceleration energy of ions are set properly according to the circumstances as long as the impurity is implanted at a desired depth.

Furthermore, the impurity dose can be set at a high value of $1.0 \times 10^{16}$ ions/cm$^2$ or more.

As mentioned above, particularly when Sb is implanted into the silicon single crystal wafer 2, conventional methods produce the crystal defects at Sb-implanted portions. And it has been impossible to prevent generation of the crystal defects in the formed silicon epitaxial layer even when the wafer undergoes a heat treatment for restoring crystallinity after the Sb implantation.

Accordingly, to reduce generation of the crystal defects, there have been no other choice but to implant the impurity at a low dose. For example, when Sb is implanted as the impurity, conventionally, Sb has to be implanted at a dose of less than $1.0 \times 10^{16}$ ions/cm$^2$.

On the other hand, the method for producing an epitaxial wafer with a buried diffusion layer according to the present invention makes it possible to reduce effectively generation of crystal defects in a silicon epitaxial layer to be subsequently formed even when an impurity such as Sb is implanted, for example, at a high dose of $1.0 \times 10^{16}$ ions/cm$^2$ or more.

After the impurity is implanted as mentioned above, the silicon single crystal wafer 2 undergoes a heat treatment to diffuse the impurity, for example, with a thermal diffusion furnace. Thus a diffusion layer 3 is formed (see FIG. 2(I)). At this moment, the heat treatment provides an oxide film 8 on the surface of the diffusion layer 3 and over the surface of the silicon single crystal wafer.

Then, the oxide film 8 and the oxide film 5 formed in the former oxidizing process are removed (see FIG. 2(J)).

As mentioned above, the oxide film 5 and 8 have conventionally been removed by etching with hydrofluoric acid. In contrast to this, the present inventors have investigated and found that conditions for removing the oxide film 5 and 8 influence generation of crystal defects in a silicon epitaxial layer to be subsequently formed. In the production method according to the present invention, the oxide film 5 and 8 are removed by etching with hydrofluoric acid to which a surfactant is added. Thus generation of crystal defects in the epitaxial layer is reduced.

As for the surfactant, for example, an anionic surfactant, a cationic surfactant, a nonionic surfactant, an ampholytic surfactant, and so on can be used.

The surfactant is not limitative. Examples thereof may include: nonionic surfactants such as polyoxyethylene alkyl ethers such as polyoxyethylene lauryl ether, polyoxyethylene cetyl ether, polyoxyethylene olein ether; polyoxyethylene alkyl aryl ethers such as polyoxyethylene octyl-phenol ether, polyoxyethylene nonyl phenol; polyoxyethylene polyoxy propylene block copolymers; sorbitan fatty acid esters such as sorbitan monolaurate, sorbitan monopalmitate, sorbitan monostearate; polyoxyethylene sorbitan fatty acid esters such as polyoxyethylene sorbitan monolaurates, polyoxyethylene sorbitan monopalmitate, polyoxyethylene sorbitan monostearate, polyoxyethylene sorbitan trioleate, polyoxyethylene sorbitan tristearate; fluorinated surfactants such as EFTOP EF301, EF303 and EF352 (manufactured by Tohkem), MEGAFACE F171, F172, and F173 (manufactured by Dainippon Ink Industry), Fluorad FC-430, FC-431 (manufactured by Sumitomo 3M), Asahiguard AG710, Surflon S-381, S-382, SC101, SC102, SC103, SC104, SC105 and SC106, Surfynol E1004, KH-10, KH-20, KH-30 and KH-40 (manufactured by Asahi Glass Co., Ltd.); organo siloxane polymer KP-341, X-70-092, X-70-093 (manufactured by Shin-Etsu Chemical Co., Ltd.); acrylic or methacrylic POLYFLOW No. 75, No. 95 (KYOEISHA CHEMICAL Co., Ltd.).

Incidentally, to remove certainly the oxide film, particles, and so on, the wafer may further be cleaned, for example, with the SC-1 solution (ammonia and aqueous hydrogen peroxide) and so on.

Then after the oxide film 5 and 8 on the surface are removed, a silicon epitaxial layer 4 is formed (see FIG. 2(K)), for example, with epitaxial growth systems. A method for forming the epitaxial layer 4 is also not particularly limited. For example, vapor-phase epitaxy, photo-assisted vapor-phase epitaxy, and so on can be used.

In commonly used vapor-phase epitaxy, silane gas such as HSiCl$_3$ as an epitaxial source gas, and H$_2$ as a carrier gas are introduced to epitaxial growth systems. Then the gases are reacted at approximately 800 to 1300 degrees C. to form the silicon epitaxial layer 4 on the surface of a wafer which is supported on a susceptor.

In this manner, forming the silicon epitaxial layer 4 turns the diffusion layer 3 into a buried diffusion layer 3'. Thus the epitaxial wafer 1 with the buried diffusion layer is produced.

The method for producing an epitaxial wafer with a buried diffusion layer according to the present invention makes it possible to reduce generation of crystal defects in the silicon epitaxial layer 4 to be formed effectively and easily. Therefore, an epitaxial wafer 1 with a buried diffusion layer produced by the production method according to the present invention is of extremely high quality in which the crystal defects is reduced.

Furthermore, when Sb is implanted as an impurity, the present invention is effectively used. Because the present invention reduces generation of crystal defects when Sb is implanted at a high dose of $1.0 \times 10^{16}$ ions/cm$^2$ or more. Conventionally, there have been no other choice but to implant Sb at a low dose of less than $1.0 \times 10^{16}$ ions/cm$^2$ to reduce generation of crystal defects. And it has been difficult to obtain an epitaxial wafer of high quality with high dose of Sb.

EXAMPLE

Hereinafter, the present invention will be explained further in detail with reference to Examples and Comparative Examples. However, the present invention is not limited thereto.

Examples 1 to 4

Sample wafers were prepared by processing a silicon single crystal ingot produced by the Czochralski method. Each wafer was mirror-polished and was a p-type wafer with a diameter of 6 inches (15 cm), a crystal orientation <100>, and a resistivity of 10 Ω·cm.

On the surface of each sample wafer, an oxide film with a thickness of 200 Å was formed with a CVD apparatus. Then in the oxide film, a pattern of openings through which an impurity would be implanted was formed as follows.

First, resist was applied to the wafer by spin coating. Then the resist was exposed to transfer the mask pattern to the resist. The resist was developed. Thereafter, the oxide film was removed by etching with hydrofluoric acid with using the pattern-formed resist film as a mask. Then remaining resist was removed by delamination, and pattern-formed oxide film was obtained.

Next, Sb was implanted into each sample wafer with an ion implantation apparatus. At this time, acceleration energy of ions were 60 keV, and Sb dose was $0.9 \times 10^{16}$ ions/cm$^2$ (Example 1), $1.0 \times 10^{16}$ ions/cm$^2$ (Example 2), $1.1 \times 10^{16}$ ions/cm$^2$ (Example 3), and $1.2 \times 10^{16}$ ions/cm$^2$ (Example 4).

Then, each sample wafer underwent a heat treatment at 1150 degrees C. for 3 hours with a thermal diffusion furnace to form a diffusion layer. At this moment, a thickness of an oxide film on the surface of each sample wafer was approximately 2000 Å. An oxide film was formed also on the diffusion layer.

The oxide film was removed by etching with diluted hydrofluoric acid (10 wt %) to which 0.5 wt % of a surfactant (product name: NCW-1002, component: polyoxy alkylene alkyl ether, nonion type) was added. Furthermore, each sample wafer was cleaned with the SC-1 solution, and was dried with IPA vapor.

A non-doped silicon epitaxial layer with a thickness of 10 μm was formed on each sample wafer with introducing trichlorosilane as an epitaxial source gas and H$_2$ as a carrier gas into vapor-phase epitaxial growth systems. Thus an epitaxial wafer with a buried diffusion layer was produced.

Then, the surface of the silicon epitaxial layer of thus-obtained wafer was subjected to preferential etching with mixed acid. In this way, crystal defects existing on the surface were made evident. The surface was observed with an optical microscope, and a density of the defects was measured.

Figure 3:
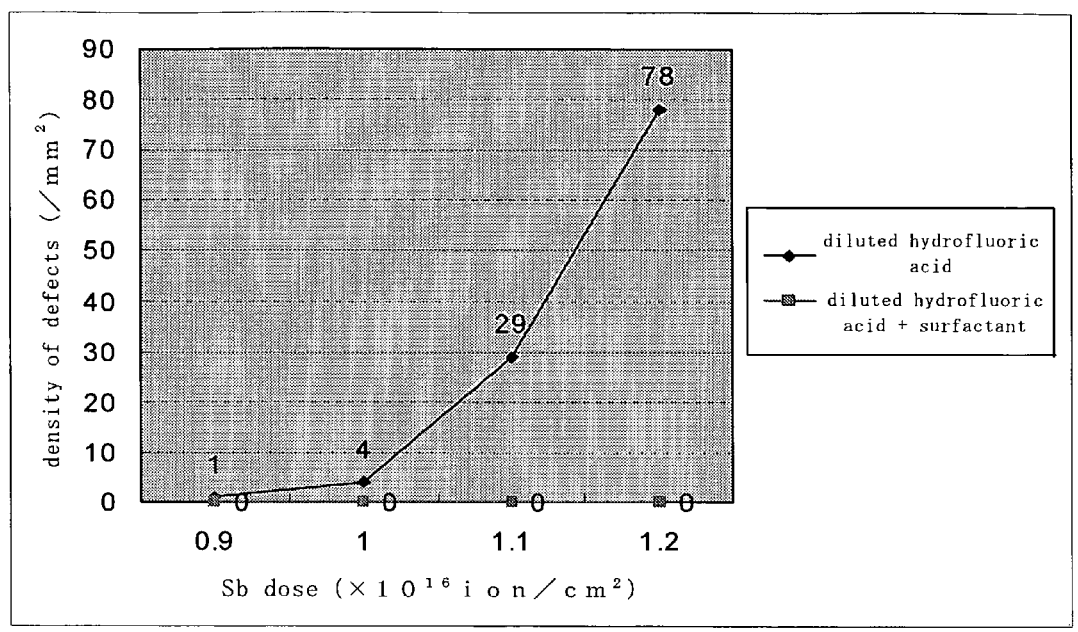
FIG. 3 is a graph showing a density of crystal defects on the surface of each wafer in Examples and in Comparative Examples.

The measured results are shown in FIG. 3. As is evident from FIG. 3, a defects density was 0 per mm$^2$ in Examples 1 to 4 in which the production method according to the present invention was carried out. Consequently, epitaxial wafers with a buried diffusion layer of extremely high quality were obtained.

In summary, use of the production method according to the present invention makes it possible to reduce crystal defects in a silicon epitaxial layer. As shown in Examples 1 to 4, even when Sb is implanted as the impurity, a defect-free epitaxial wafer having a buried diffusion layer with a high Sb dose of $1.0 \times 10^{16}$ ions/cm$^2$ or more can be obtained.

Comparative Examples 1 to 4

Epitaxial wafers with a buried diffusion layer were produced as with Examples 1 to 4, except that each oxide film was removed with diluted hydrofluoric acid (10 wt %) without a surfactant before epitaxial growth. Then, crystal defects were measured as with above. Each Sb dose was $0.9 \times 10^{16}$ ions/cm$^2$ (Comparative Example 1), $1.0 \times 10^{16}$ ions/cm$^2$ (Comparative Example 2), $1.1 \times 10^{16}$ ions/cm$^2$ (Comparative Example 3), and $1.2 \times 10^{16}$ ions/cm$^2$ (Comparative Example 4).

The measured results are shown in FIG. 3. Each defects density was 1 per mm$^2$ (Comparative Example 1), 4 per mm$^2$ (Comparative Example 2), 29 per mm$^2$ (Comparative Example 3), and 78 per mm$^2$ (Comparative Example 4). In summary, each defects density of Comparative Examples is larger that that of Examples especially when Sb dose is $1.0 \times 10^{16}$ ions/cm$^2$ or more. The larger Sb dose becomes, the larger the difference of defects density between Examples and Comparative Examples becomes. Thus it is evident that the present invention is effective.

The present invention is not limited to the embodiment described above. The above-described embodiment is mere an example, and those having substantially the same structure as technical ideas described in the appended claims and providing the similar functions and advantages are included in the scope of the present invention.

What is claimed is:

1. A method for producing an epitaxial wafer with a buried diffusion layer comprising:
   implanting an impurity into a silicon single crystal wafer;
   subsequently diffusing the impurity in the wafer to form a diffusion layer;
   at least removing an oxide film on the diffusion layer; and
   thereafter forming a silicon epitaxial layer over the wafer to produce a silicon epitaxial wafer with a buried diffusion layer;
   wherein, at least, Sb is implanted into the silicon single crystal wafer as the impurity at a dose of $1.0 \times 10^{16}$ ions/cm$^2$ or more,
   the oxide film on the diffusion layer is removed by etching with hydrofluoric acid to which a surfactant is added in order to reduce generation of crystal defects in the silicon epitaxial layer to be formed subsequently,
   and then the silicon epitaxial layer is formed.

* * * * *